United States Patent
Kim et al.

(10) Patent No.: US 10,319,283 B2
(45) Date of Patent: Jun. 11, 2019

(54) GATE DRIVING CIRCUIT AND DISPLAY DEVICE INCLUDING THE SAME

(71) Applicant: LG DISPLAY CO., LTD., Seoul (KR)

(72) Inventors: Byungil Kim, Gimpo-si (KR); Seokhwan Choi, Gwangju (KR)

(73) Assignee: LG DISPLAY CO., LTD., Seoul (KR)

( * ) Notice: Subject to any disclaimer, the term of this patent is extended or adjusted under 35 U.S.C. 154(b) by 218 days.

(21) Appl. No.: 15/371,985

(22) Filed: Dec. 7, 2016

(65) Prior Publication Data

US 2017/0169757 A1 Jun. 15, 2017

(30) Foreign Application Priority Data

Dec. 15, 2015 (KR) .......................... 10-2015-0179281

(51) Int. Cl.
| | | |
|---|---|---|
| *G11C 19/00* | (2006.01) | |
| *G09G 3/20* | (2006.01) | |
| *G11C 19/28* | (2006.01) | |
| *G09G 3/36* | (2006.01) | |

(52) U.S. Cl.
CPC ............ *G09G 3/2092* (2013.01); *G09G 3/20* (2013.01); *G11C 19/28* (2013.01); *G09G 3/3677* (2013.01); *G09G 2300/043* (2013.01); *G09G 2300/0408* (2013.01); *G09G 2300/0809* (2013.01); *G09G 2300/0819* (2013.01); *G09G 2310/0267* (2013.01); *G09G 2310/0286* (2013.01); *G09G 2310/0291* (2013.01)

(58) Field of Classification Search
None
See application file for complete search history.

(56) References Cited

U.S. PATENT DOCUMENTS

| | | | | |
|---|---|---|---|---|
| 4,849,653 A | * | 7/1989 | Imai ....................... | H03K 3/013 327/198 |
| 4,914,318 A | * | 4/1990 | Allen ................ | H03K 3/356104 326/44 |
| 5,508,648 A | * | 4/1996 | Banik ................. | H03K 3/35625 327/203 |
| 5,552,737 A | * | 9/1996 | Chen ................ | H03K 3/356043 327/199 |
| 6,232,810 B1 | * | 5/2001 | Oklobdzija ............ | H03K 3/012 327/217 |

(Continued)

FOREIGN PATENT DOCUMENTS

KR 10-2014-0141213 A 12/2014

*Primary Examiner* — Tuan T Lam
(74) *Attorney, Agent, or Firm* — Birch, Stewart, Kolasch & Birch, LLP (57) ABSTRACT

Provided are a gate driving circuit and a display device including the same. The gate driving circuit according to an embodiment includes a shift register including a plurality of stages. An nth stage of the stages includes a latch control circuit including a first NMOS transistor connected to a QB node, a second NMOS transistor connected to a Q node, and a third NMOS transistor having a gate electrode to which a first clock is input and connected to the first and second NMOS transistors, where n is a positive integer. A latch is connected between the Q and QB nodes. A transmission gate is connected to the Q and QB nodes. In the gate driving circuit, output signals of a previous stage and a following stage are controlled so as to be synchronized with the first clock to suppress a glitch.

14 Claims, 7 Drawing Sheets

(56) References Cited

U.S. PATENT DOCUMENTS

| | | | | |
|---|---|---|---|---|
| 6,580,411 | B1* | 6/2003 | Kubota | G09G 3/3677 345/100 |
| 7,091,756 | B2* | 8/2006 | Collier | H03K 23/542 327/115 |
| 7,196,699 | B1* | 3/2007 | Kubota | G09G 3/3677 345/100 |
| 2003/0112047 | A1* | 6/2003 | Dike | H03K 3/0375 327/202 |
| 2009/0121998 | A1* | 5/2009 | Ohkawa | G09G 3/3688 345/100 |
| 2012/0268432 | A1* | 10/2012 | Huang | G11C 19/28 345/204 |
| 2013/0249876 | A1* | 9/2013 | Huang | G11C 19/28 345/205 |
| 2013/0257703 | A1* | 10/2013 | Huang | G11C 19/28 345/100 |
| 2014/0055334 | A1* | 2/2014 | Qing | G09G 3/3611 345/100 |
| 2014/0313174 | A1* | 10/2014 | Murakami | G11C 19/28 345/204 |
| 2015/0228354 | A1* | 8/2015 | Qing | G11C 19/28 345/100 |
| 2015/0248867 | A1* | 9/2015 | Tan | G09G 3/3648 345/100 |
| 2016/0351112 | A1* | 12/2016 | Qing | G09G 3/20 |
| 2016/0365050 | A1* | 12/2016 | Qing | G09G 3/3677 |
| 2017/0178559 | A1* | 6/2017 | Kim | G09G 3/2092 |
| 2017/0178560 | A1* | 6/2017 | Lee | G09G 3/2092 |
| 2017/0365220 | A1* | 12/2017 | Huang | G09G 3/3225 |

* cited by examiner

GATE DRIVING CIRCUIT AND DISPLAY DEVICE INCLUDING THE SAME

CROSS-REFERENCE TO RELATED APPLICATIONS

This application claims the priority of Korean Patent Application No. 10-2015-0179281 filed on Dec. 15, 2015, in the Korean Intellectual Property Office, the disclosure of which is incorporated herein by reference.

BACKGROUND

Field

The present disclosure relates to a gate driving circuit and a display device including the same, and more particularly, to a gate driving circuit capable of reducing glitches and a display device including the same.

Description of the Related Art

Flat panel displays (FPDs) have been employed in various electronic devices such as mobile phones, tablet PCs, notebook computers as well as televisions and monitors. Recently, for example, a liquid crystal display device (hereinafter, referred to as "LCD") and an organic light emitting diode display (hereinafter, referred to as "OLED") have been used as an FPD. Such a display device includes a plurality of pixels, a pixel array configured to display an image and including a plurality of pixels, and a driving circuit configured to control each of the plurality of pixels to transmit or emit a light. The driving circuit of the display device includes a data driving circuit configured to supply a data signal to data lines in the pixel array. Further, the driving circuit includes a gate driving circuit (or a scan driving circuit) configured to sequentially supply a gate signal (or a scan signal) synchronized with the data signal to gate lines (or scan lines) in the pixel array. Furthermore, the driving circuit includes a timing controller configured to control the data driving circuit and the gate driving circuit.

Each of the plurality of pixels may include a thin film transistor configured to supply a voltage of a data line to a pixel electrode in response to a gate signal supplied through a gate line. The gate signal swings between a gate high voltage (VGH) and a gate low voltage (VGL). That is, the gate signal has a pulse shape. The VGH is set to be higher than a threshold voltage of the thin film transistor in a display panel. The VGL is set to be lower than the threshold voltage of the thin film transistor. The thin film transistors in the pixels are turned on in response to the VGH.

In recent years, as display devices have been manufactured to be thin, a technology of embedding a gate driving circuit and a pixel array in a display panel has been developed. The gate driving circuit embedded in the display panel is known as a "gate in panel (GIP) circuit". Herein, the gate driving circuit includes a shift register for generating a gate signal. The shift register includes a plurality of stages dependently connected to each other. The plurality of stages generates an output in response to a start signal and shifts the output according to a shift clock. Therefore, the gate driving circuit may generate a gate signal by sequentially driving the plurality of stages in the shift register.

Each stage in the shift register includes a Q node for charging a gate line, a Q bar (QB) node for discharging the gate line, and a switch circuit connected to the Q node and the QB node. The switch circuit charges the Q node in response to a start signal or an output voltage of a previous stage so as to increase an output voltage of the gate line and then discharges the QB node in response to an output voltage of a following stage or a reset signal.

As such, each stage is driven to output a gate signal depending on an output signal of a previous stage and an output signal of a following stage. Thus, if a noise signal such as a glitch is included in the output signal of the previous stage, the Q node may be charged in response to the noise signal of the previous stage and a gate signal may be output at an undesired time. Further, if a noise signal such as a glitch is included in the output signal of the following stage, the QB node may be discharged in response to the noise signal of the following stage and a gate signal may not be output at a desired time. That is, an output signal of a stage is dependent on output signals of a previous stage and a following stage, and, thus, there may be a problem with stability of a gate signal due to a noise signal such as a glitch.

Accordingly, there is a need for a gate driving circuit capable of reducing a problem caused by a glitch by controlling output signals of a previous stage and a following stage, and a display device including the same.

SUMMARY

The inventors of the present disclosure address instability of a gate signal dependent on output signals of a previous stage and a following stage as described above. To do this, the inventors of the present disclosure invented a novel structure of a gate driving circuit including a circuit for controlling output signals of a previous stage and a following stage and a display device including the driving circuit.

Accordingly, an object to be achieved by the present disclosure is to provide a gate driving circuit capable of reducing glitches in a gate signal by controlling output signals of a previous stage and a following stage, and to provide a display device including the same.

Further, another object to be achieved by the present disclosure is to provide a gate driving circuit capable of maximizing output stability of a gate signal with respect to noise signals of a previous stage and a following stage using a control circuit for reducing glitches in the gate signal, and to provide a display device including the same.

The objects of the present disclosure are not limited to the aforementioned objects, and other objects, which are not mentioned above, will be apparent to a person having ordinary skill in the art from the following description.

According to an aspect of the present disclosure, there is provided a gate driving circuit. The gate driving circuit includes a shift register including a plurality of stages. An nth stage of the plurality of stages includes a latch control circuit including a first NMOS transistor connected to a QB node, a second NMOS transistor connected to a Q node, and a third NMOS transistor having a gate electrode to which a first clock is input and connected to the first NMOS transistor and the second NMOS transistor. A latch is connected between the Q node and the QB node. A buffer includes a transmission gate connected to the Q node and the QB node and having a source electrode to which a second clock is input. Herein, n is a positive integer. In the gate driving circuit according to an aspect of the present disclosure, output signals of a previous stage and a following stage are controlled so as to be synchronized with the first clock to suppress a glitch.

According to another aspect of the present disclosure, there is provided a gate driving circuit. The gate driving circuit includes a shift register including a plurality of stages. An nth stage of the plurality of stages includes a latch control circuit configured to control, based on a first clock, a first carry signal received from an n−1th stage, and a second carry signal received from an n+1th stage, a QB node to have a low voltage when the first clock and the first carry signal have high voltages, and a Q node to have a low voltage when the first clock and the second carry signal have high voltages. A latch is connected between the Q node and the QB node. A buffer increases an output voltage to be synchronized with a second clock when the Q node has a high voltage and decreases the output voltage when the QB node has a high voltage. Herein, n is a positive integer. The gate driving circuit according to another aspect of the present disclosure may control effects of output signals of a previous stage and a following stage, and, thus, glitches in a gate signal may be reduced.

Details of other exemplary embodiments will be included in the detailed description of the disclosure and the accompanying drawings.

According to the present disclosure, it is possible to manufacture a gate driving circuit including a circuit capable of effectively controlling output signals of a previous stage and a following stage, and a display device including the same.

Further, according to the present disclosure, it is possible to manufacture a gate driving circuit capable of reducing glitches in a gate signal by controlling a switch to which output signals of a previous stage and a following stage are input, and a display device including the same.

The effects of the present disclosure are not limited to the aforementioned effects, and various other effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the entire specification, the same reference numerals generally denote the same elements but variations may apply.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

Figure 1:
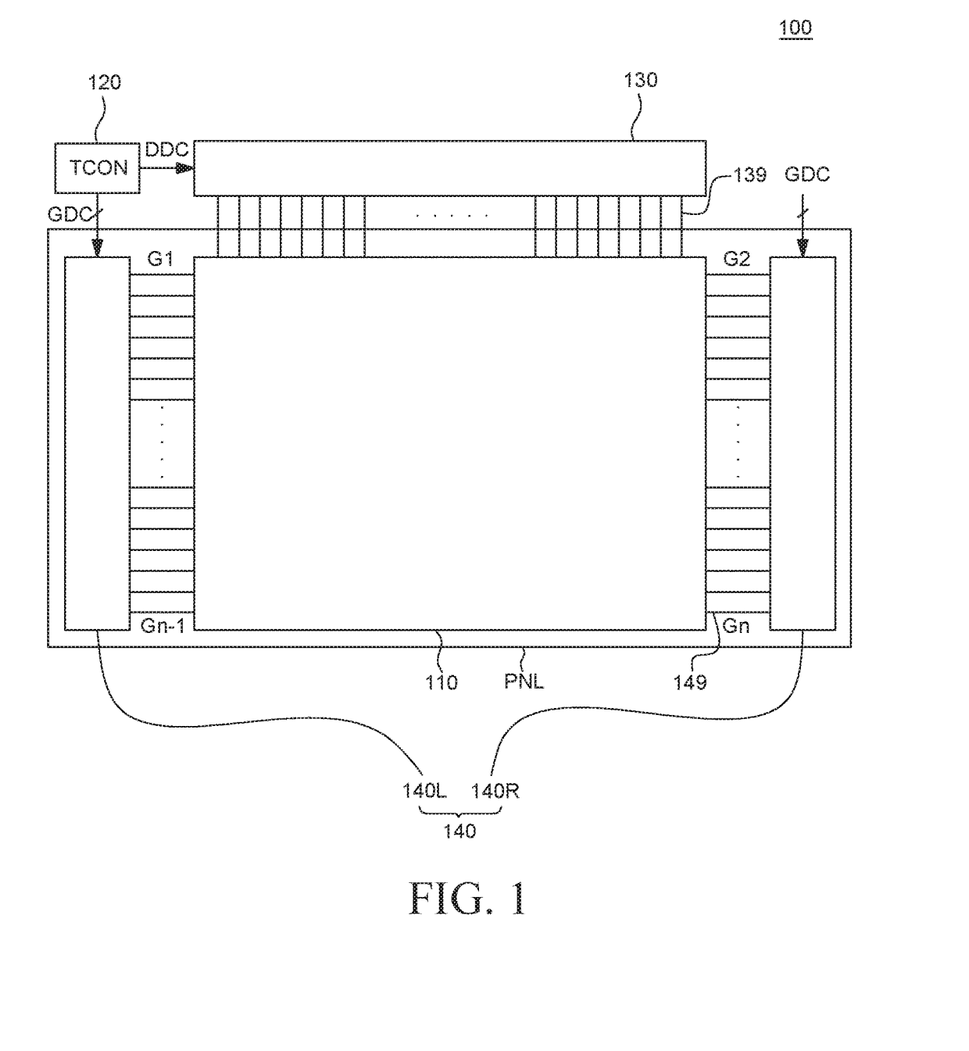
FIG. 1 is a block diagram illustrating a driving circuit of a display device and relationships of the display device according to an exemplary embodiment of the present disclosure.

FIG. 1 is a block diagram illustrating a driving circuit of a display device and relationships of the display device according to an exemplary embodiment of the present disclosure. All the components of the display device according to all embodiments of the present disclosure are operatively coupled and configured.

Referring to FIG. 1, a display device 100 includes a display panel PNL and a driving circuit configured to input data of an input image into a pixel array 110 of the display panel PNL.

The display panel PNL includes a plurality of data lines 139, a plurality of gate lines 149 perpendicularly intersect with the plurality of data lines 139. Further, the display panel PNL includes the pixel array 110 in which pixels are disposed in a matrix form as defined by the plurality of data lines 139 and the plurality of gate lines 149.

The driving circuit of the display device 100 includes a data driving circuit 130 configured to supply a data voltage to the plurality of data lines 139. Further, the driving circuit includes a gate driving circuit configured to sequentially supply a gate signal synchronized with the data voltage to the plurality of gate lines 149 and a timing controller (TCON) 120.

The timing controller 120 is configured to transmit data of an input image received from an external host system to the data driving circuit 130 and the gate driving circuit. The timing controller 120 is configured to receive timing signals, such as a vertical synchronization signal, a horizontal synchronization signal, a data enable signal, and a dot clock, synchronized with the input image from the external host system. The timing controller 120 is configured to generate various control signals for controlling operation timings of the data driving circuit 130 and the gate driving circuit on the basis of the input timing signals. That is, the timing controller 120 generates a data driver control signal DDC for controlling the data driving circuit 130 and a gate driver control signal GDC for controlling the gate driving circuit. The timing controller 120 may be disposed outside the display panel PNL. Specifically, the timing controller 120 is disposed on a pad such as a printed circuit board. Accordingly, the timing controller 120 transmits the data driver control signal DDC to the data driving circuit 130 and the gate driver control signal GDC to the gate driver, i.e., a GIP circuit 140 from the outside of the display panel PNL.

The data driving circuit 130 is configured to receive the data of the input image and the data driver control signal DDC from the timing controller 120. The data driving circuit 130 generates a data voltage by converting the data of the input image into a gamma compensation voltage in response to the data driver control signal DDC transmitted from the timing controller 120. Then, the data driving circuit 130 outputs the data voltage to the plurality of data lines 139. The data driving circuit 130 includes a plurality of source electrode driver integrated circuits (ICs). The source electrode driver ICs are connected to a plurality of data lines 139 through a Chip On Glass (COG) process or a Tape Automated Bonding (TAB) process.

The gate driving circuit includes a level shifter and the GIP circuit 140. Herein, the level shifter may be disposed to be physically separated from the GIP circuit 140. The level shifter may be disposed outside the display panel PNL, or may be disposed in an external circuit unit (for example, printed circuit board) connected to the display panel PNL.

A voltage level of the gate driver control signal GDC transmitted from the timing controller 120 is converted by the level shifter. Then, the gate driver control signal GDC is input into the GIP circuit 140.

A signal input into the level shifter is a digital signal and thus cannot drive thin film transistors in the display panel PNL. Therefore, the level shifter converts each gate driver control signal GDC transmitted from the timing controller 120 into a signal swinging between a gate low voltage VGL and a gate high voltage VGH by shifting a voltage of each gate driver control signal GDC. The VGH is set to be higher than a threshold voltage of the thin film transistors in the display panel PNL. The VGL is set to be lower than the threshold voltage of the thin film transistors.

The gate driving circuit may be disposed on one edge or both edges of the display panel PNL according to a driving method of the GIP circuit 140. The gate driving circuit illustrated in FIG. 1 is an interlace-type GIP circuit 140 and disposed on left and right edges of the display panel PNL. That is, the GIP circuit 140 includes a first GIP circuit 140L disposed on the left of the display panel PNL and a second GIP circuit 140R disposed on the right of the display panel PNL. The location of the gate driving circuit in the display panel PNL is not limited to those illustrated in FIG. 1 and may be implemented in various ways according to an exemplary embodiment. In the following, a configuration and an operation of the gate driving circuit will be described on the basis of the interlace-type GIP circuit 140.

The gate driving circuit may be formed on the pixel array 110 and a substrate of the display panel PNL at the same time. That is, the GIP circuit 140 of the gate driving circuit may be formed on the pixel array 110 and both bezel areas of the display panel PNL at the same time.

The display device 100 according to an exemplary embodiment of the present disclosure includes the timing controller 120, the data driving circuit 130, and the GIP circuit 140 for driving the pixel array 110. Herein, the GIP circuit 140 sequentially supplies a gate signal to the gate lines 149 in response to the gate driver control signal GDC transmitted from the timing controller 120. Particularly, the GIP circuit 140 may receive a signal for controlling the timing of supplying a gate signal to the gate lines among the gate driver control signals GDC and thus reduce possible problems of the gate signal caused by a noise signal. Hereinafter, a detailed configuration of the GIP circuit 140 of the gate driving circuit will be described with reference to FIG. 2.

Figure 2:
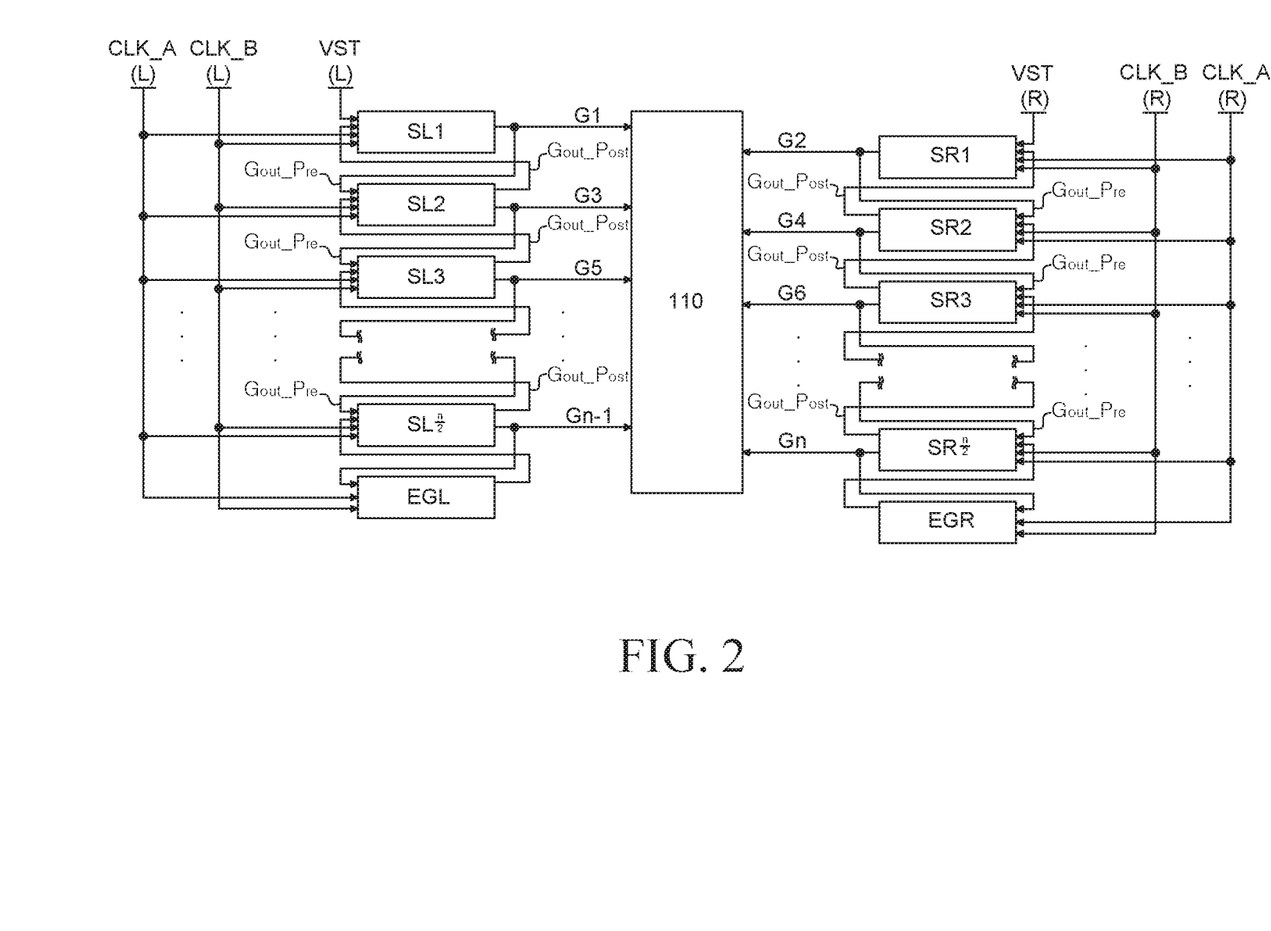
FIG. 2 is a block diagram illustrating relationships between a plurality of stages in a gate driving circuit and a gate driver control signal according to an exemplary embodiment of the present disclosure.

FIG. 2 is a block diagram illustrating relationships between a plurality of stages in a gate driving circuit and a gate driver control signal according to an exemplary embodiment of the present disclosure. Here "(L)" denoted together with signals and clocks is a symbol used to represent signals and clocks applied to the first GIP circuit 140L disposed on the left side. Further, "(R)" is a symbol used to represent signals and clocks applied to the second GIP circuit 140R disposed on the right side.

Referring to FIG. 2, the GIP circuit of the gate driving circuit is disposed on both sides of the pixel array 110.

The gate driving circuit includes a shift register configured to receive the gate driver control signal GDC and output a gate electrode voltage. That is, in the gate driving circuit, the shift register sequentially supplies a gate signal generated by the level shifter to the gate lines 149 through the GIP circuit 140 in response to the gate driver control signal GDC. Herein, the gate driver control signal GDC includes gate start pulses (GSP) ((VST(L) and VST(R)) and gate shift clocks (GSC) (CLK_A(L), CLK_A(R), CLK_B (L), and CLK_B(R)). Specifically, the first GIP circuit 140L includes a first shift register configured to sequentially supply a gate signal to odd-numbered gate lines G1, G3, . . . , Gn−1. The second GIP circuit 140R is disposed on the right of the display panel PNL and includes a second shift register configured to sequentially supply a gate signal to even-numbered gate lines G2, G4, . . . , Gn.

Each shift register includes dummy stages which do not generate an output but supply a second carry signal Gout_Post to another stage. That is, the first shift register includes a first dummy stage EGL as a following stage of a last stage SLn/2, and the second shift register includes a second dummy stage EGR as a following stage of a last stage SRn/2. That is, the dummy stages EGL and EGR are respectively connected to the last stages SLn/2 and SRn/2 each configured to output a last gate signal. Further, the dummy stages EGL and EGR do not output gate signals but supply second carry signals Gout_Post to the last stages SLn/2 and SRn/2.

Each shift register includes a plurality of stages. Specifically, the first shift register disposed on the left of the pixel array 110 includes a plurality of stages SL1 to SLn/2 dependently connected to each other. The stages SL1 to SLn/2 in the first shift register start outputting gate signals in response to a gate start pulse VST(L) and shift and output the gate signals in response to a second gate shift clock CLK_B(L). The gate signals output from the respective stages SL1 to SLn/2 are supplied to the odd-numbered gate lines G1, G3, ..., Gn−1 and input into a following stage as first carry signals Gout_Pre at the same time.

Likewise, the second shift register disposed on the right of the pixel array 110 includes a plurality of stages SR1 to SRn/2n dependently connected to each other. The stages SR1 to SRn/2n in the second shift register start outputting gate signals in response to a gate start pulse VST(R) and shift and output the gate signals in response to a second gate shift clock CLK_B(R). The gate signals output from the respective stages SR1 to SRn/2 are supplied to the even-numbered gate lines G2, G4, ... Gn and input into a following stage as first carry signals Gout_Pre at the same time.

Further, first gate shift clocks CLK_A(L) are input into the stages SL1 to SLn/2 in the first shift register. The first gate shift clocks CLK_A(L) control the timing of inputting the first carry signals Gout_Pre and the second carry signals Gout_Post to the first shift register. Likewise, first gate shift clocks CLK_A(R) are input into the stages SR1 to SRn/2n in the second shift register. The first gate shift clocks CLK_A(R) control the timing of inputting the first carry signals Gout_Pre and the second carry signals Gout_Post to the second shift register.

First clocks CLK_A(L) and CLK_A(R), second clocks CLK_B(L) and CLK_B(R), a first carry signal Gout_Pre or start pulses VST(L), VST(R) received from a previous stage, a second carry signal Gout_Post received from a following stage, a gate high voltage VGH, and a gate low voltage VGL are input into each shift register.

A first carry signal Gout_Pre input into an nth stage except the first stages SL1 and SR1 is an output Gout of an n−1th stage. A second carry signal Gout_Post input into an nth stage except the last stages SLn/2 and SRn/2 is an output Gout of an n+1th stage. The first carry signal Gout_Pre is not input into the first stages SL1 and SR1, but start pulses VST(L) and VST(R) are input into the first stages SL1 and SR1. The second carry signal Gout_Post is not input into the last stages SLn/2 and SRn/2, but a reset pulse is input into the last stages SLn/2 and SRn/2 from a dummy stage.

The second clocks CLK_B(L) and CLK_B(R) as gate shift clocks have phase differences from the first clocks CLK_A(L) and CLK_A(R). The second clocks CLK_B(L) and CLK_B(R) may be generated subsequently to the first clock CLK_A.

The gate driving circuit according to an exemplary embodiment of the present disclosure includes a shift register including a plurality of stages. Various gate driver control signals GDC are input into each of the plurality of stages to shift a gate signal, and each of the plurality of stages supplies the shifted gate signal to a gate line. Herein, the gate driver control signals GDC input into each of the plurality of stages include a gate start pulse VST, a first gate shift clock CLK_A, a second gate shift clock CLK_B, etc. The first gate shift clock CLK_A of the gate driver control signals GDC may control the timing of inputting a first carry signal Gout_Pre input from a previous stage and a second carry signal Gout_Post input from a following stage. Accordingly, even if noises such as glitches are generated in the first carry signal Gout_Pre and the second carry signal Gout_Post, each of the plurality of stages may supply a shifted gate signal to a gate line at an appropriate time using the first gate shift clock CLK_A. Hereinafter, a detailed circuit configuration of the stage will be described with reference to FIG. 3.

Figure 3:
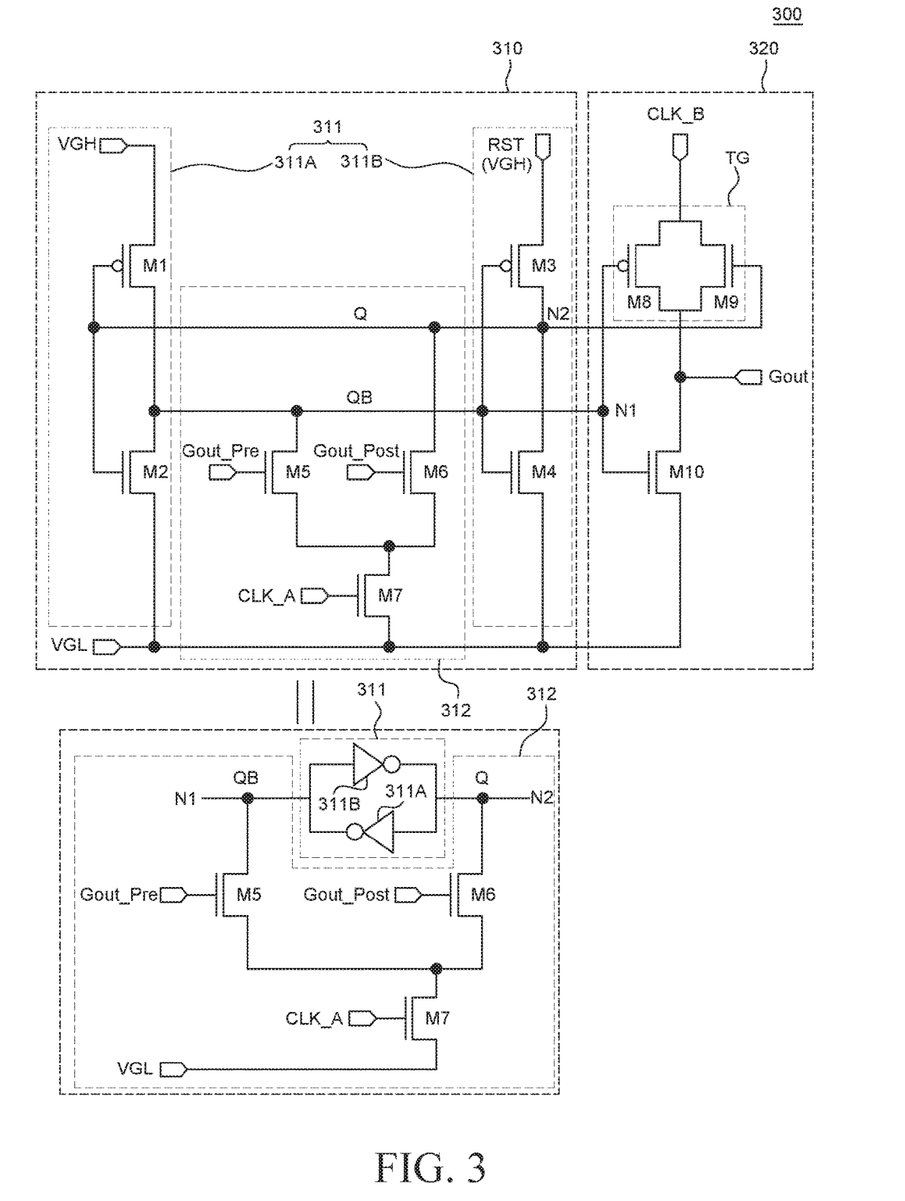
FIG. 3 is a circuit diagram illustrating a configuration of one of the plurality of stages illustrated in FIG. 2 according to an exemplary embodiment of the present disclosure.

FIG. 3 is a circuit diagram illustrating a configuration of one of the plurality of stages illustrated in FIG. 2 according to an exemplary embodiment of the present disclosure. The circuit illustrated in FIG. 3 is an nth stage circuit 300 (n is a positive integer). In FIG. 3, M1, M3, and M8 are implemented as p-type MOSFETs (hereinafter, referred to as "PMOS transistors") and M2, M4, M5, M6, M7, M9, and M10 are implemented as n-type MOSFETs (hereinafter, referred to as "NMOS transistors"). For convenience in explanation, FIG. 1 and FIG. 2 will also be referred to.

Referring to FIG. 3, the nth stage circuit 300 includes a control circuit unit 310 and a buffer 320.

The control circuit unit 310 includes a latch 311 and a latch control circuit 312 configured to control an operation of the latch 311. The control circuit unit 310 includes five NMOS transistors M2, M4, M5, M6, and M7 and two PMOS transistors M1 and M3. The control circuit unit 310 includes a Q node and a QB node. The Q node and the QB node supply signals to the buffer 320 through an N2 node and an N1 node, respectively. That is, the control circuit unit 310 controls an operation of the buffer 320 using a high voltage or a low voltage of the Q node and the QB node.

The latch 311 includes two NMOS transistors M2 and M4 and two PMOS transistors M1 and M3. Further, the latch 311 includes a first inverter 311A and a second inverter 311B connected to each other in a closed-loop feedback circuit, and is connected between the Q node and the QB node. Specifically, the first inverter 311A in the latch 311 includes one PMOS transistor M1 and one NMOS transistor M2, and the second inverter 311B includes one PMOS transistor M3 and one NMOS transistor M4. The PMOS transistor M1 in the first inverter 311A includes a gate electrode connected to the Q node, a drain electrode connected to the QB node, and a source electrode connected to a high voltage power line VGH. The NMOS transistor M2 in the first inverter 311A includes a gate electrode connected to the Q node, a drain electrode connected to the QB node, and a source electrode connected to a low voltage power line VGL. Likewise, the PMOS transistor M3 in the second inverter 311B includes a gate electrode connected to the QB node, a drain electrode connected to the Q node, and a source electrode connected to the high voltage power line VGH. The NMOS transistor M4 in the second inverter 311B includes a gate electrode connected to the QB node, a drain electrode connected to the Q node, and a source electrode connected to the low voltage power line VGL.

The latch 311 controls an output voltage by inverting a voltage of the Q node and a voltage of the QB node. The voltage of the Q node and the voltage of the QB node in the latch 311 are inputs of the buffer 320 and control the supply timing of an output voltage to a gate line.

The latch control circuit 312 includes three NMOS transistors M5 to M7. Specifically, the latch control circuit 312 includes a first NMOS transistor M5 including a drain electrode connected to the QB node and a gate electrode to which a first carry signal Gout_Pre is input. Further, the latch control circuit 312 includes a second NMOS transistor M6 including a drain electrode connected to the Q node and a gate electrode to which a second Gout_Post is input. Furthermore, the latch control circuit 312 includes a third NMOS transistor M7 including a drain electrode connected to the source electrode of the first NMOS transistor M5 and the source electrode of the second NMOS transistor M6 and a gate electrode to which a first clock CLK_A is input. Herein, a source electrode of the third NMOS transistor M7 is connected to the low voltage power line VGL.

The latch control circuit 312 controls voltages applied to the Q node and the QB node of the latch 311 using a gate high voltage or a gate low voltage. Specifically, the latch control circuit 312 controls the first carry signal Gout_Pre to decrease a voltage of the QB node and the second carry signal Gout_Post to decrease a voltage of the Q node in response to the first clock CLK_A input into the gate electrode of the third NMOS transistor M7.

The buffer 320 includes a transmission gate TG and a pull-down transistor M10. The transmission gate TG includes one PMOS transistor M8 and one NMOS transistor M9. Source electrodes of the respective PMOS transistor M8 and NMOS transistor M9 are connected to each other. Drain electrodes of the respective PMOS transistor M8 and NMOS transistor M9 are connected to each other. That is, the transmission gate TG is a switch element which can reduce an ON-resistance $R_{ON}$ since the NMOS transistor M9 and the PMOS transistor M8 are connected in parallel to each other, and can be driven in a full range of voltages. The pull-down transistor M10 is formed of the NMOS transistor M9.

The buffer 320 is connected to the Q node and the QB node of the control circuit unit 310. The PMOS transistor M8 in the transmission gate TG includes a gate electrode to which a signal of the QB node is input and a drain electrode connected to a drain electrode of the pull-down transistor M10 and a drain electrode of an output node Gout. The NMOS transistor M9 in the transmission gate TG includes a gate electrode to which a signal of the Q node is input and a drain electrode connected to the drain electrode of the pull-down transistor M10 and the output node Gout. Further, the transmission gate TG includes a source electrode to which a second clock CLK_B is input. The pull-down transistor M10 includes a gate electrode connected to the QB node, the drain electrode connected to the low voltage power line VGL, and a source electrode connected to the drain electrode of the transmission gate TG.

If a voltage of the Q node is a gate high voltage, the buffer 320 increases an output voltage synchronized with the second clock CLK_B. If a voltage of the QB node is a gate high voltage, the buffer 320 decreases an output voltage. Therefore, if a voltage of the Q node is a gate high voltage, an output signal is synchronized with the second clock CLK_B and supplied to a gate line through the output node Gout of the buffer 320. Likewise, if a voltage of the QB node is a gate high voltage, the output node Gout of the buffer 320 is connected to the low voltage power line VGL and thus an output voltage is decreased.

The nth stage circuit 300 according to an exemplary embodiment of the present disclosure includes the control circuit unit 310 formed of the latch 311 and the latch control circuit 312, and the buffer 320. The latch control circuit 312 controls output voltages of the Q node and the QB node of the latch 311 using a first carry signal Gout_Pre and a second carry signal Gout_Post. Particularly, the latch control circuit 312 includes the third NMOS transistor M7 configured to control the timing of inputting the first carry signal Gout_Pre and the second carry signal Gout_Post. Further, the latch control circuit 312 controls input of the first carry signal Gout_Pre and the second carry signal Gout_Post using the first clock CLK_A input into the gate electrode of the third NMOS transistor M7. Herein, the first carry signal Gout_Pre and the second carry signal Gout_Post are synchronized with the first clock CLK_A.

Accordingly, the first clock CLK_A controls whether or not to activate the first NMOS transistor M5 and the second NMOS transistor M6 in order not to increase or decrease voltages of the Q node and the QB node due to a noise signal included in the first carry signal Gout_Pre and the second carry signal Gout_Post. That is, the latch control circuit 312 controls the first carry signal Gout_Pre and the second carry signal Gout_Post for controlling voltages of the Q node and the QB node using the first clock CLK_A. Thus, the latch control circuit 312 can improve stability of a gate signal output using voltages of the Q node and the QB node.

Hereinafter, detailed relationships between various signals input into the nth stage circuit 300 and an output voltage will be described with reference to FIG. 4 through FIG. 5C.

Figure 4:
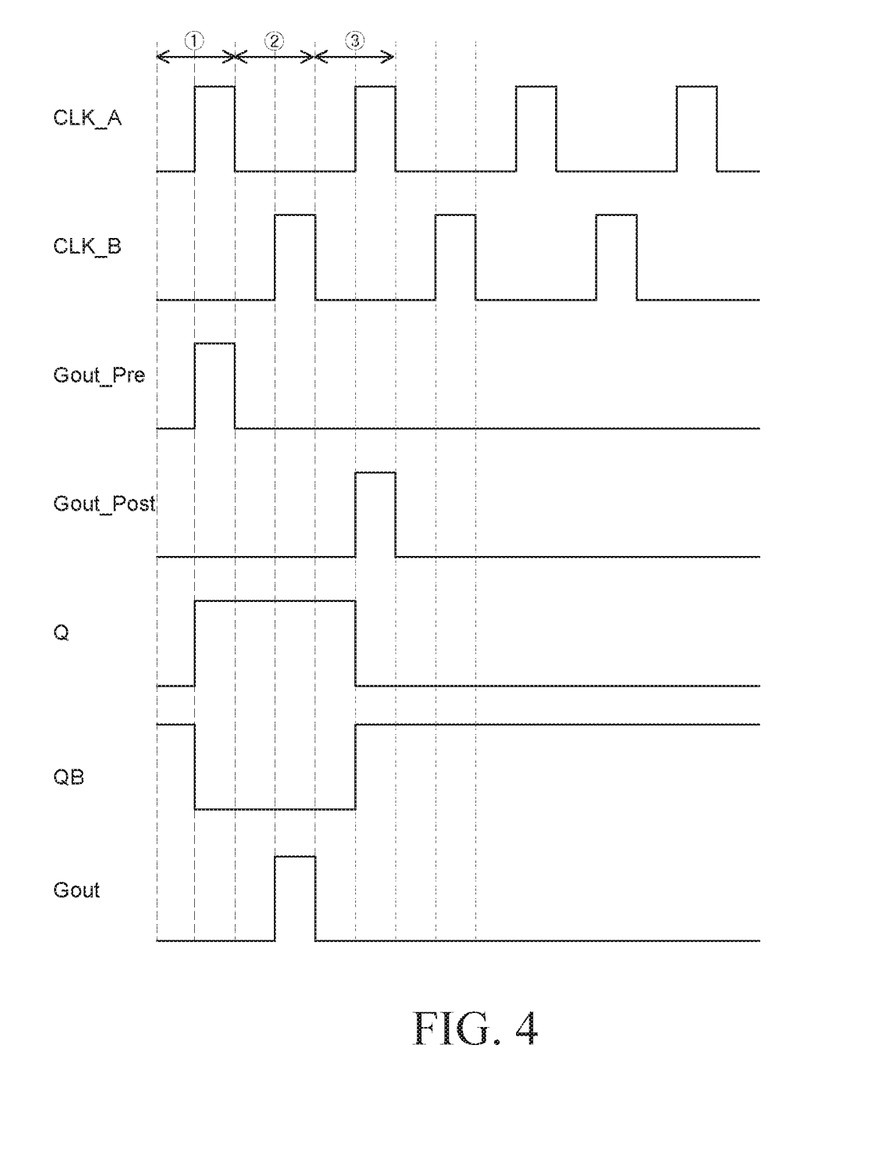
FIG. 4 is a waveform diagram showing input/output signals of the stage illustrated in FIG. 3 according to an exemplary embodiment of the present disclosure.

FIG. 4 is a waveform diagram showing input/output signals of the stage illustrated in FIG. 3 according to an exemplary embodiment of the present disclosure. FIG. 5A through FIG. 5C are circuit diagrams illustrating flows of signals within the stage during the respective sections of the waveform diagram illustrated in FIG. 4 according to an exemplary embodiment of the present disclosure. A stage circuit 500 illustrated in FIG. 5A through FIG. 5C shows an active state of the stage circuit 300 illustrated in FIG. 3 caused by signals input into the stage circuit 300. Thus, the stage circuit 500 is substantially the same as the stage circuit 300 illustrated in FIG. 3, and the redundant description thereof will be omitted or may be brief.

Figure 5A:
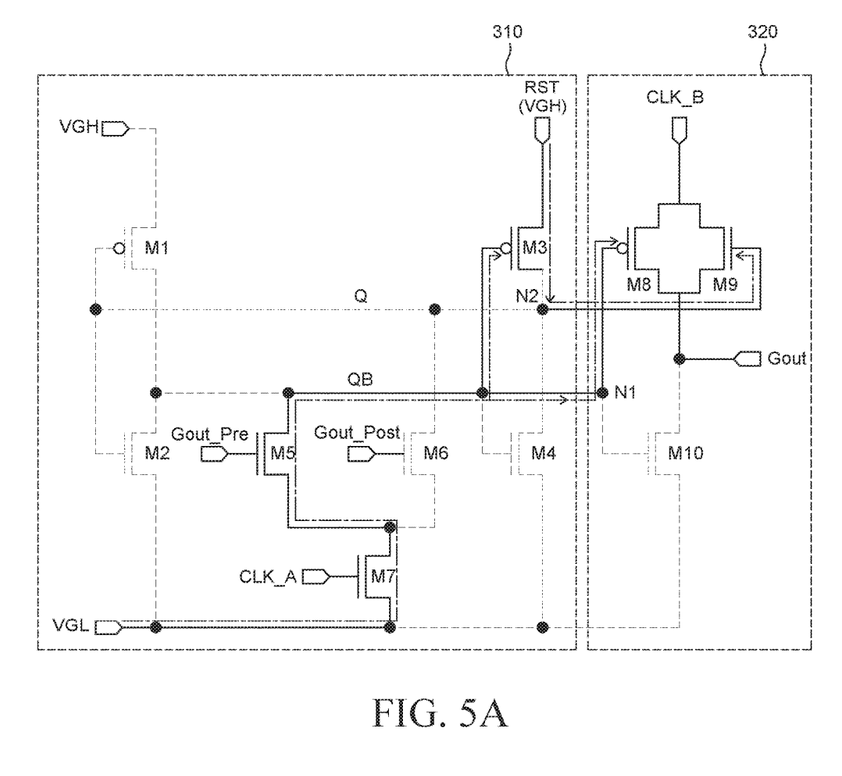
FIG. 5A through FIG. 5C are circuit diagrams illustrating flows of signals within the stage during the respective sections of the waveform diagram illustrated in FIG. 4 according to an exemplary embodiment of the present disclosure.
Figure 5B:
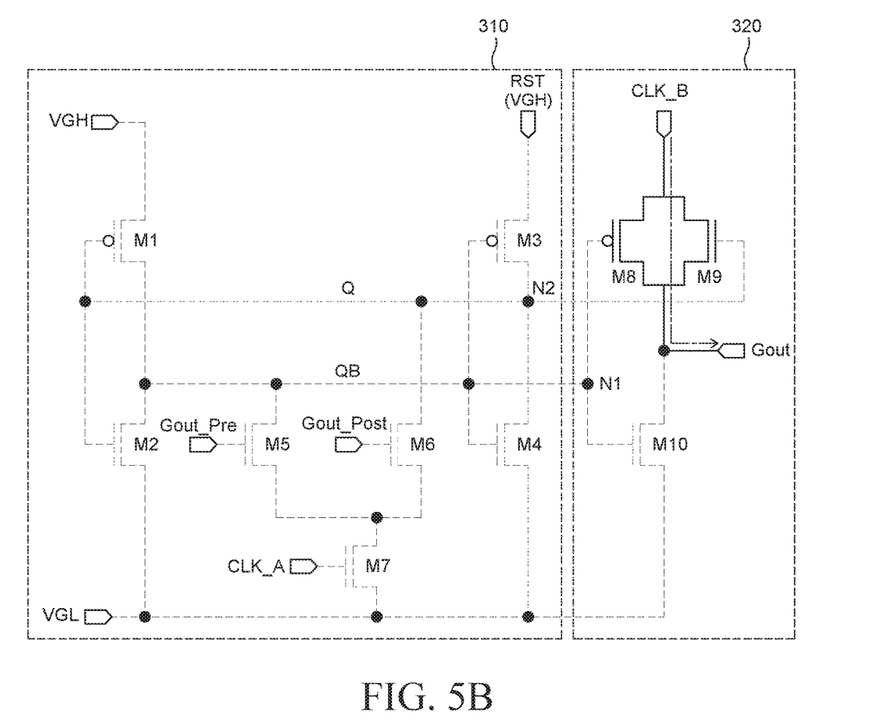
Figure 5C:
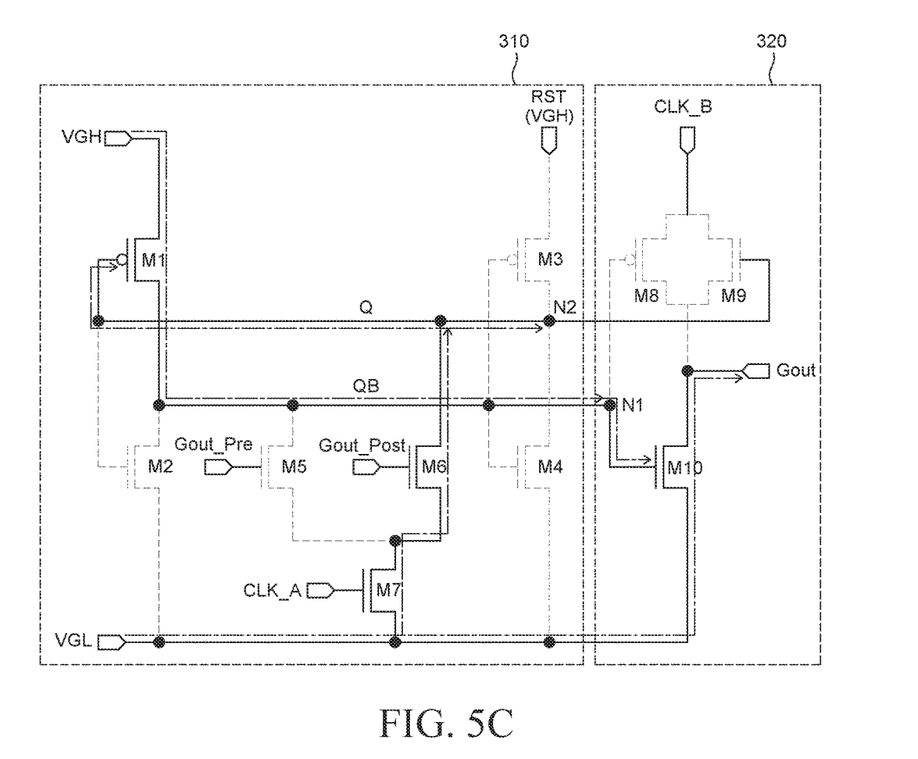

In FIG. 5A through FIG. 5C, an alternate long and short dash line indicates a flow of an internal signal in response to a signal input into the nth stage circuit 300. Further, a dotted line indicates a portion which is not activated in response to the signal input into the nth stage circuit 300.

Referring to FIG. 4 and FIG. 5A, during a section $\hat{1}$, the first clock CLK_A and the first carry signal Gout_Pre have a gate high voltage VGH. That is, if the first clock CLK_A having the gate high voltage VGH is applied to the latch control circuit 312, the M7 is turned on. Further, if the first carry signal Gout_Pre having the gate high voltage VGH is applied thereto, the M5 is also turned on. Accordingly, if the first clock CLK_A and the first carry signal Gout_Pre synchronized with the first clock CLK_A have the gate high voltage VGH, the QB node is controlled to have a gate low voltage VGL. When the gate low voltage VGL is applied to the QB node, the Q node is controlled to have the gate high voltage VGH by the inverter of the latch 311.

During the section $\hat{1}$ of FIG. 4, when the control circuit unit 310 applies the gate low voltage VGL to the QB node and the gate high voltage VGH to the Q node, the M8 of the buffer 320 connected to the QB node and the M9 of the buffer 320 connected to the Q node are turned on.

According to the related art, if a noise signal is included in the first carry signal Gout_Pre, a voltage of the Q node is increased due to the noise signal in the first carry signal Gout_Pre. Therefore, according to the related art, a gate signal may be supplied to a gate line at an undesired time due to the noise signal in the first carry signal Gout_Pre. However, during the section $\hat{1}$, if the first carry signal Gout_Pre includes a noise at the time when the gate high voltage VGH is not applied to the first clock CLK_A, the first carry signal Gout_Pre is synchronized with the first clock CLK_A. Thus, it is possible to suppress an increase in voltage of the Q node caused by the noise signal included in the first carry signal Gout_Pre.

Then, referring to FIG. 4 and FIG. 5B, during a section $\hat{2}$, the second clock CLK_B has the gate high voltage VGH. That is, the second clock CLK_B is input into the transmission gate TG of the buffer 320.

During the section $\hat{2}$, the M8 and M9 turned on during the section $\hat{1}$ are maintained in a turn-on state. Therefore, the drain electrode of the transmission gate TG of the buffer 320 is connected to the output node Gout. The second clock CLK_B is output from the output node Gout through the transmission gate TG. That is, if a voltage of the Q node has the gate high voltage VGH, the buffer 320 increases an output voltage synchronized with the second clock CLK_B. Therefore, during the section $\hat{2}$, the clock CLK_B supplies a gate signal to a gate line through the output node Gout.

Referring to FIG. 4 and FIG. 5C, during a section $\hat{3}$, the first clock CLK_A has the gate high voltage VGH again, and the second carry signal Gout_Post has the gate high voltage VGH. That is, in the latch control circuit 312, the M7 is turned on due to the first clock CLK_A. Further, if the second carry signal Gout_Post having the gate high voltage VGH is applied, the M6 is also turned on. Therefore, if the first clock CLK_A and the second carry signal Gout_Post synchronized with the first clock CLK_A have the gate high voltage VGH, the Q node is controlled to have the gate low voltage VGL. When the gate low voltage VGL is applied to the Q node, the QB node is controlled to have the gate high voltage VGH by the inverter of the latch 311.

During the section $\hat{3}$, in the control circuit unit 310, the gate low voltage VGL is applied to the Q node and the gate high voltage VGH is applied to the QB node. Therefore, the M8 and M9 of the buffer 320 connected to the Q node are turned off and the pull-down transistor M10 is turned on. Accordingly, the gate low voltage is applied to the output node Gout, so that the output node is discharged and an output voltage is decreased. That is, if a voltage of the Q node is the gate high voltage VGH, the buffer 320 decreases an output voltage synchronized with the second clock CLK_B.

According to the related art, if a noise signal is included in the second carry signal Gout_Post, a voltage of the QB node is increased due to the noise signal in the second carry signal Gout_Post. Therefore, according to the related art, a gate signal may not be supplied to a gate line at a desired time due to the noise signal in the second carry signal Gout_Post. However, during the section $\hat{3}$, if the second carry signal Gout_Post includes a noise at the time when the gate high voltage VGH is not applied to the first clock CLK_A, the second carry signal Gout_Post is synchronized with the first clock CLK_A. Thus, it is possible to suppress a decrease in voltage of the QB node caused by the noise signal included in the second carry signal Gout_Post.

The gate driving circuit according to an exemplary embodiment of the present disclosure includes the latch control circuit 312 for controlling the latch 311 configured to control an output voltage by inverting a voltage of the Q node and a voltage of the QB node. Further, the latch control circuit 312 includes the third NMOS transistor M7 configured to control the first NMOS transistor M5 and the second NMOS transistor M6. The first clock CLK_A synchronized with the first carry signal Gout_Pre applied to the gate electrode of the first NMOS transistor M5 and the second carry signal Gout_Post applied to the second NMOS transistor M6 is input into the third NMOS transistor M7. Specifically, only when both the M5 and the M7 are turned on due to the first clock CLK_A synchronized with the first carry signal Gout_Pre, the QB node has the gate low voltage VGL and the Q node has the gate high voltage VGH.

Further, only when both the M6 and the M7 are turned on due to the first clock CLK_A synchronized with the second carry signal Gout_Post, the Q node has the gate low voltage VGL and the QB node has the gate high voltage VGH. That is, voltages of the Q node and the QB node are controlled using the first clock CLK_A together with the first carry signal Gout_Pre and the second carry signal Gout_Post.

Accordingly, it is possible to control operations of the latch 311 and the buffer 320 by adding the transistor M7 configured to control whether or not to activate the transistors M5 and M6 to which the first carry signal Gout_Pre and the second carry signal Gout_Post are input. That is, the first clock CLK_A controlling input of the first carry signal Gout_Pre and the second carry signal Gout_Post can suppress malfunctions of the latch 311 and the buffer 320 caused by at least one of a noise signal in the first carry signal Gout_Pre and a noise signal in the second carry signal Gout_Post. Accordingly, it is possible to suppress a noise of an output voltage.

The exemplary embodiments of the present disclosure can also be described as follows.

According to an aspect of the present disclosure, there is provided a gate driving circuit. The gate driving circuit includes a shift register including a plurality of stages. An nth stage of the plurality of stages includes a latch control circuit including a first NMOS transistor connected to a QB node, a second NMOS transistor connected to a Q node, and a third NMOS transistor having a gate electrode to which a first clock is input and connected to the first NMOS transistor and the second NMOS transistor. A latch is connected between the Q node and the QB node. A buffer includes a transmission gate connected to the Q node and the QB node and having a source electrode to which a second clock is input. Herein, n is a positive integer. In the gate driving circuit according to an aspect of the present disclosure, output signals of a previous stage and a following stage are controlled so as to be synchronized with the first clock to suppress a glitch.

In the latch control circuit, the first NMOS transistor may include a gate electrode to which a first carry signal is input and a drain electrode connected to the QB node, and the second NMOS transistor may include a gate electrode to which a second carry signal is input and a drain electrode connected to the Q node.

The third NMOs transistor may include a source electrode to a low voltage power line and a drain electrode connected to a source electrode of the first NMOS transistor and a source electrode of the second NMOS transistor.

The latch includes a first inverter and a second inverter connected to each other in a closed-loop feedback circuit. The first inverter includes a fourth NMOS transistor having a gate electrode connected to the Q node, a drain electrode connected to the QB node, and a source electrode connected to a low voltage power line; and a first PMOS transistor having a gate electrode connected to the Q node, a drain electrode connected to the QB node, and a source electrode connected to a high voltage power line. The second inverter includes a fifth NMOS transistor having a gate electrode connected to the QB node, a drain electrode connected to the Q node, and a source electrode connected to the low voltage power line; and a second PMOS transistor having a gate electrode connected to the QB node, a drain electrode connected to the Q node, and a source electrode connected to the high voltage power line.

The buffer may include a pull-down transistor having a gate electrode connected to the QB node, a drain electrode connected to a low voltage power line, and a source electrode connected to a drain electrode of the transmission gate.

The transmission gate includes a sixth NMOS transistor having a gate electrode to which a signal of the Q node is input and a drain electrode connected to the drain electrode of the pull-down transistor and an output node; and a third PMOS transistor having a gate electrode to which a signal of the QB node is input and a drain electrode connected to the drain electrode of the pull-down transistor and the output node.

According to another aspect of the present disclosure, there is provided a gate driving circuit. The gate driving circuit includes a shift register configured to a plurality of stages. An nth stage of the plurality stages includes a latch control circuit configured to control, on the basis of a first clock, a first carry signal received from an n−1th stage, and a second carry signal received from an n+1th stage, a QB node to have a low voltage when the first clock and the first carry signal have high voltages, and a Q node to have a low voltage when the first clock and the second carry signal have high voltages. A latch is connected between the Q node and the QB node. A buffer increases an output voltage to be synchronized with a second clock when the Q node has a high voltage and decreases the output voltage when the QB node has a high voltage. Herein, n is a positive integer. The gate driving circuit according to another aspect of the present disclosure may control effects of output signals of a previous stage and a following stage, and, thus, glitches in a gate signal may be reduced.

The latch control circuit may be configured to receive the first clock and suppress a noise of an output voltage generated by at least one of a noise signal in the first carry signal and a noise signal in the second carry signal.

The latch control circuit may be configured to be synchronized with the first carry signal and suppress an increase in voltage of the Q node caused by a noise signal in the first carry signal.

The latch control circuit may be configured to be synchronized with the second carry signal and suppress a decrease in voltage of the QB node caused by a noise signal in the second carry signal.

The latch may control the output voltage by inverting the voltage of the Q node and the voltage of the QB node.

The buffer may include a pull-down transistor configured to decrease the output voltage by discharging an output node so as to correspond to the voltage of the QB node.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

What is claimed is:

1. A gate driving circuit comprising:
a shift register including a plurality of stages,
wherein an nth stage of the plurality of stages includes:
a latch control circuit including a first NMOS transistor connected to a QB node, a second NMOS transistor connected to a Q node, and a third NMOS transistor having a gate electrode to which a first clock is input and connected to the first NMOS transistor and the second NMOS transistor;
a latch connected between the Q node and the QB node; and
a buffer including a transmission gate connected to the Q node and the QB node and having a source electrode to which a second clock is input,
wherein n is a positive integer,
wherein in the latch control circuit, the first NMOS transistor includes a gate electrode to which a first carry signal from an n−1th stage is input and a drain electrode connected to the QB node, and the second NMOS transistor includes a gate electrode to which a second carry signal from an n+1th stage is input and a drain electrode connected to the Q node, and
wherein the first carry signal from an n−1th stage is not an inverting signal of the second carry signal from an n+1th stage.

2. The gate driving circuit according to claim 1, wherein the third NMOS transistor includes:
a source electrode connected to a low voltage power line, and
a drain electrode connected to a source electrode of the first NMOS transistor and a source electrode of the second NMOS transistor.

3. The gate driving circuit according to claim 1, wherein the latch includes a first inverter and a second inverter connected to each other in a closed-loop feedback circuit,
wherein the first inverter includes:
a fourth NMOS transistor having a gate electrode connected to the Q node, a drain electrode connected to the QB node, and a source electrode connected to a low voltage power line; and
a first PMOS transistor having a gate electrode connected to the Q node, a drain electrode connected to the QB node, and a source electrode connected to a high voltage power line, and
wherein the second inverter includes:
a fifth NMOS transistor having a gate electrode connected to the QB node, a drain electrode connected to the Q node, and a source electrode connected to the low voltage power line; and
a second PMOS transistor having a gate electrode connected to the QB node, a drain electrode connected to the Q node, and a source electrode connected to the high voltage power line.

4. The gate driving circuit according to claim 1, wherein the buffer includes:
a pull-down transistor having a gate electrode connected to the QB node,
a drain electrode connected to a low voltage power line, and
a source electrode connected to a drain electrode of the transmission gate.

5. The gate driving circuit according to claim 4, wherein the transmission gate includes:
a sixth NMOS transistor having a gate electrode to which a signal of the Q node is input and a drain electrode connected to the drain electrode of the pull-down transistor and an output node; and
a third PMOS transistor having a gate electrode to which a signal of the QB node is input and a drain electrode connected to the drain electrode of the pull-down transistor and the output node.

6. The gate driving circuit according to claim 1, wherein the first carry signal and the second carry signal are synchronized with the first clock.

7. The gate driving circuit according to claim 6, wherein a first pulse of the first carry signal and a second pulse of the second carry signal occur at different times and correspond to different pulses of the first clock, and
wherein a leading edge of a pulse of the first carry signal is aligned with a leading edge of a pulse of the first clock, and a leading edge of a pulse of the second carry signal is aligned with a leading edge of another pulse of the first clock.

8. The gate driving circuit according to claim 1, wherein an output of the nth stage is synchronized with a pulse of the second clock and supplied to a gate line.

9. A gate driving circuit comprising:
a shift register configured to a plurality of stages,
wherein an nth stage of the plurality of stages includes:
a latch control circuit configured to control, based on a first clock, a first carry signal received from an n−1th stage, and a second carry signal received from an n+1th stage, a QB node to have a low voltage when the first clock and the first carry signal have high voltages, and a Q node to have a low voltage when the first clock and the second carry signal have high voltages;
a latch connected between the Q node and the QB node; and
a buffer configured to increase an output voltage to be synchronized with a second clock when the Q node has a high voltage and decrease the output voltage when the QB node has a high voltage,
wherein n is a positive integer, and
wherein the first carry signal from an n−1th stage is not an inverting signal of the second carry signal from an n+1th stage.

10. The gate driving circuit according to claim 9, wherein the latch control circuit is configured to receive the first clock and suppress a noise of an output voltage generated by at least one of a noise signal in the first carry signal and a noise signal in the second carry signal.

11. The gate driving circuit according to claim 9, wherein the latch control circuit is configured to be synchronized with the first carry signal and suppress an increase in voltage of the Q node caused by a noise signal in the first carry signal.

12. The gate driving circuit according to claim 9, wherein the latch control circuit is configured to be synchronized with the second carry signal and suppress a decrease in voltage of the QB node caused by a noise signal in the second carry signal.

13. The gate driving circuit according to claim 9, wherein the latch controls the output voltage by inverting the voltage of the Q node and the voltage of the QB node.

14. The gate driving circuit according to claim 9, wherein the buffer includes a pull-down transistor configured to decrease the output voltage by discharging an output node so as to correspond to the voltage of the QB node.

* * * * *